United States Patent [19]

Dieny

[11] Patent Number: 5,677,625
[45] Date of Patent: Oct. 14, 1997

[54] GIANT MAGNETORESISTANCE, PRODUCTION PROCESS AND APPLICATION TO A MAGNETIC SENSOR

[75] Inventor: Bernard Dieny, Seyssinet, France

[73] Assignee: Commissariat a l'Energie Atomique, Paris, France

[21] Appl. No.: 589,844

[22] Filed: Jan. 22, 1996

[30] Foreign Application Priority Data

Jan. 24, 1995 [FR] France ................... 95 00763

[51] Int. Cl.$^6$ .............. G01R 33/09; G11B 5/39; H01L 43/08
[52] U.S. Cl. ............ 324/252; 204/192.2; 338/32 R; 360/113; 428/694 TM
[58] Field of Search ................. 324/252, 207.21; 338/32 R; 360/113; 365/158; 204/192.2; 427/127, 128; 428/692, 694 T, 694 TM

[56] References Cited

U.S. PATENT DOCUMENTS

| | | | |
|---|---|---|---|
| 4,949,039 | 8/1990 | Grunberg | 324/252 |
| 5,206,590 | 4/1993 | Dieny et al. | 324/252 |
| 5,287,238 | 2/1994 | Baumgart et al. | 360/113 |
| 5,313,186 | 5/1994 | Schuhl et al. | 324/252 X |
| 5,422,571 | 6/1995 | Gurney et al. | 324/252 |
| 5,462,795 | 10/1995 | Shinjo et al. | 324/252 X |
| 5,465,185 | 11/1995 | Heim et al. | 324/252 X |
| 5,508,867 | 4/1996 | Cain et al. | 324/252 X |
| 5,549,978 | 8/1996 | Iwasaki et al. | 324/252 X |

FOREIGN PATENT DOCUMENTS

| | | |
|---|---|---|
| 628835 | 12/1994 | European Pat. Off. . |
| 2698965 | 1/1995 | France . |
| 4312040 | 10/1993 | Germany . |

OTHER PUBLICATIONS

IEEE Translation Journal ...., vol. 7, No. 9/92, "Magnetoresistance of multilayers" by H. Yamamoto et al. pp. 674–684.

B. Dieny, Journal of Magnetism and Magnetic Materials 136, 1994, pp. 335–359.

Physical review B, vol. 43, No. 1, Jan. 1991, "Giant magnetoresistance in soft . . . ." by B. Dieny et al., pp. 1297–1300.

D.A. Thompson et al., IEEE Trans. Mag. Mag–11, p. 1039, 1975.

*Primary Examiner*—Gerard R. Strecker
*Attorney, Agent, or Firm*—Pearne, Gordon, McCoy & Granger LLP

[57] ABSTRACT

A magnetoresistance having three ferromagnetic layers (10, 20, 30) separated by non-magnetic layers (15, 25). The first ferromagnetic layer (10) has a magnetization orientable by a measuring current, the second layer (20) has a "free" magnetization and the third ferromagnetic layer (50) has a trapped or fixed magnetization.

13 Claims, 3 Drawing Sheets

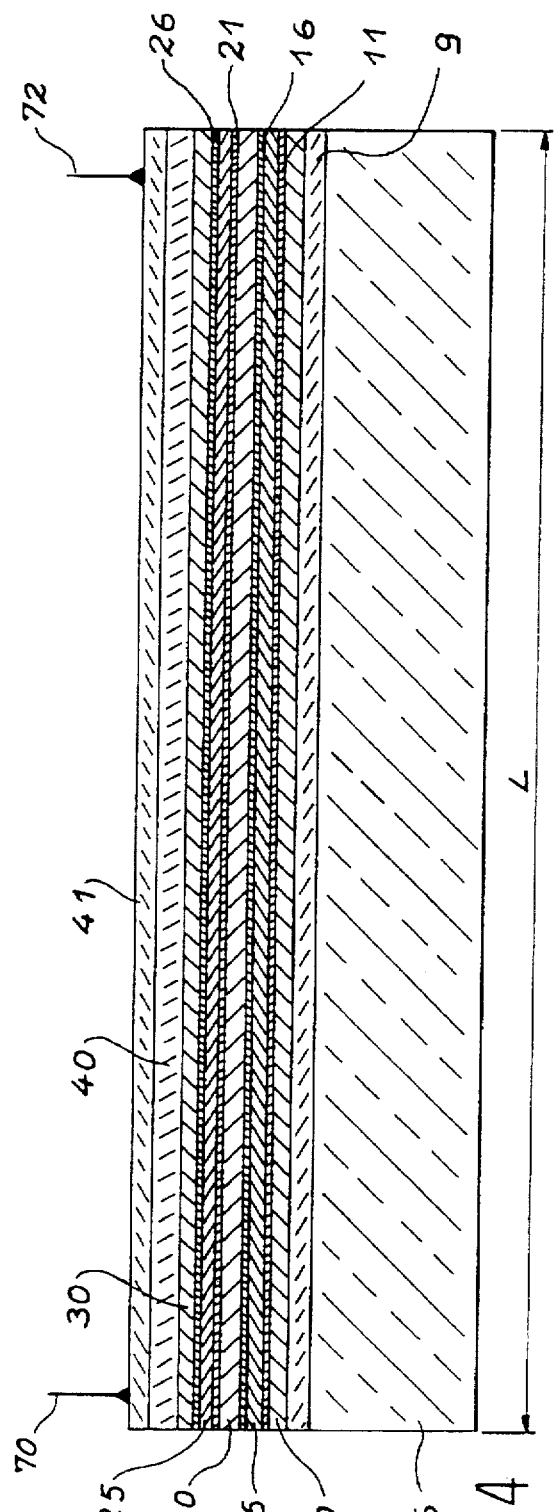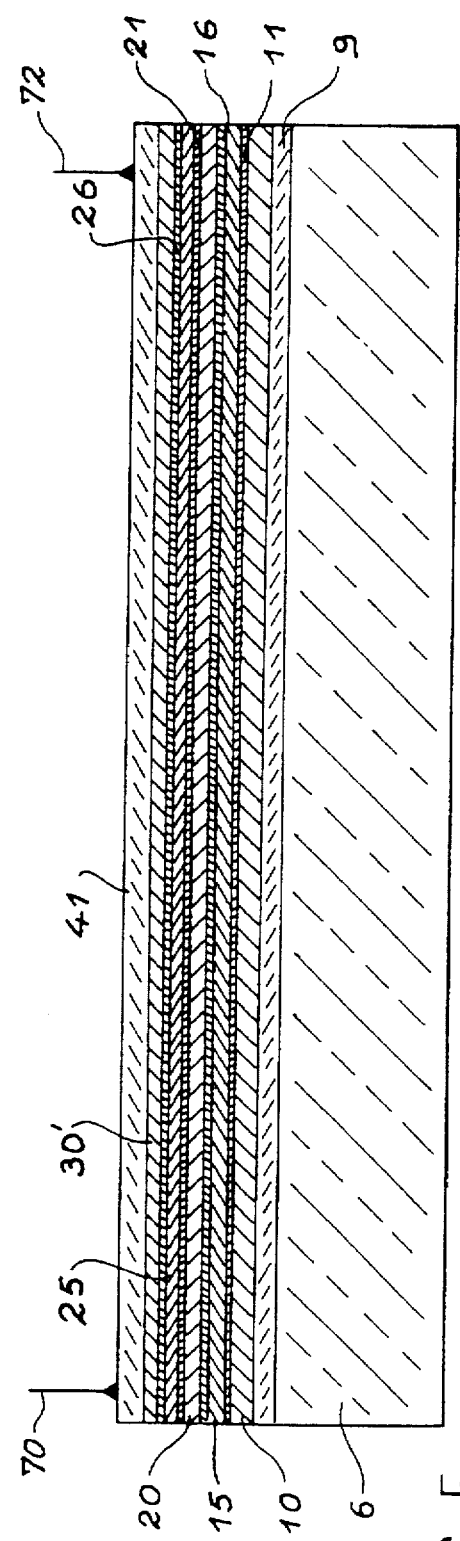

GIANT MAGNETORESISTANCE, PRODUCTION PROCESS AND APPLICATION TO A MAGNETIC SENSOR

TECHNICAL FIELD

In general terms, the present invention relates to magnetic flux or field detectors and more particularly to magnetoresistive sensors of the type used e.g. for reading informations entered on a magnetic support. It also relates to magnetoresistances constituting the sensitive component of these sensors. The magnetoresistance according to the invention, produced in thin layer or film form using microelectronic methods, is particularly appropriate for the measurement of magnetic fields from a few A/m to a few thousand A/m. It can also be used in the determination of a current flowing in conductors from the magnetic field prevailing in the vicinity of said conductors, the manufacture of magnetoresistive compasses or various position sensors.

PRIOR ART

It is known that the operation of magnetoresistive sensors used for the detection of weak magnetic fields, particularly for reading informations entered on a magnetic support, is based on an effect known as the spontaneous anisotropy effect of the magnetoresistance. This effect, which occurs in ferromagnetic transition metals such as nickel, cobalt and iron, as well as their alloys, consists of a variation of the resistivity of the magnetic material as a function of the angle between the direction of the measuring current flowing in the magnetoresistive element and the magnetization of the material. For a more detailed description of this effect, reference can be made to document (1) at the end of the description. The relative change of the resistivity of the magnetic material $\Delta \rho/\rho$ can reach 4 to 5% at ambient temperature for fields of roughly 1000 A/m in solid ferromagnetic transition metals. However, this amplitude is reduced to 1 or 2%, when said same materials are deposited in film form, with a thickness of about 15 to 30 nm. This thickness range is that used in existing magnetoresistive sensors produced according to microelectronic component production procedures. Therefore the sensitivity of such sensors is limited. Their response is also not linear as a result of the fact of the resistivity variation being proportional to the square of the cosine of the angle between the direction of the current and the magnetization.

Another effect used in magnetic sensors is known under the names "giant magnetoresistance effect" or "spin valve effect". This effect occurs in multilayer structures formed by an alternation of ferromagnetic transition metal layers and non-magnetic metal layers and is linked with a change in the relative orientation of the magnetizations of the successive ferromagnetic layers under the influence of an external magnetic field to be measured. This effect leads to a modification of the resistivity of the structure. Documents (2) and (3) at the end of the description give more details of this phenomenon.

Document (4), also appearing at the end of the description, describes in very general manner the application of this magnetoresistance effect to the production of magnetic field sensors. It also states that the materials used, such as the magnetic material and the non-magnetic material, must be chosen in such a way that a diffusion of electrons dependent on their spin occurs at the interface between the magnetic material and the non-magnetic material.

Document (5) describes a spin valve structure having in order: a silicon substrate, a first NiFe ferromagnetic layer, a copper non-magnetic layer, a second NiFe ferromagnetic layer and a FeMn antiferromagnetic layer. This spin valve structure consequently essentially comprises two ferromagnetic layers which are not magnetically coupled and separated by a non-magnetic metal.

The magnetization of the first magnetic layer, called the "free" magnetic layer, is free to follow the field applied, whereas the magnetization of the second layer is trapped by exchange anisotropy with the antiferromagnetic layer. Thus, when the field applied varies, the relative orientation of the magnetizations of the two magnetic layers changes. This also leads to a resistance change of the structure, which can be a few per cent at ambient temperature when the fields applied are below 1000 A/m.

The low value of the variation of the electrical resistance of approximately 4% is further reduced when the spin valve structure is traversed by a measuring current, due to a self-bias or autopolarization of the magnetization of the "free" layer under the effect of a magnetic field created by the measuring current, which reaches values of approximately $10^7$ A/cm².

Thus, this type of structure does not make it possible to perform a very sensitive measurement.

According to document (5), the magnetic field to be measured is applied parallel to the axis of easy magnetization of the "free" magnetic layer, said axis being itself parallel to the trapping direction of the second magnetic layer. This leads to a virtually "staircase" response of the resistance of the structure.

Document (6), appearing at the end of the description, relates to a magnetoresistive sensor also using the spin valve effect, but in a double spin valve structure. This structure comprises three magnetic layers separated from one another by a non-magnetic metal. The magnetizations of the two outer ferromagnetic layers are kept fixed and parallel to one another by exchange anisotropy with adjacent antiferromagnetic material layers, which are respectively associated therewith. The central magnetic layer is formed from a soft magnetic material and its magnetization is oriented substantially perpendicular to that of the two outer layers, in the absence of an applied magnetic field. This structure offers a magnetoresistance effect with a higher amplitude than a single spin valve. However, it is not easy to trap by exchange anisotropy the magnetization of the first magnetic layer.

The antiferromagnetic material used in document (5) is a FeMn alloy, due to its good exchange anisotropy properties. These properties only occur if the FeMn is in its cubic crystallographic phase, with centered faces (cfc). Thus, it is necessary to provide a NiFe underlayer in order to give the FeMn layer its properties and obtain a good trapping of the first ferromagnetic layer of the double spin valve. The need to obtain a FeMn layer in its cfc crystallographic phase consequently complicates the production of such structures. Moreover, part of the measuring current is derived in the NiFe underlayer, which does not contribute to the magnetoresistance effect and the amplitude of the variation of the resistance under the effect of a magnetic field is reduced.

One object of the present invention is to propose a magnetoresistance not suffering from the aforementioned disadvantages.

Another object of the invention is to propose a magnetoresistance with a good sensitivity having a high variation of the resistance under the effect of the outer magnetic field applied.

Another object of the invention is to propose a magnetoresistance, whose operation makes it possible to overcome the prejudicial effect of the self-bias phenomenon created by the measuring current in the ferromagnetic layers of spin valve structures.

A further object of the invention is to propose a magnetoresistance having a simple construction and a very stable magnetoresistive sensor.

DESCRIPTION OF THE INVENTION

To achieve these objects, the invention proposes a magnetoresistance having a stack of a first, a second and a third ferromagnetic material layer, the second layer being separated from the first and third layers respectively by a first and a second non-magnetic, electrically conductive material layer, and made from a soft material having a magnetization which can be modified by an external magnetic field, characterized in that one of the first and third layers has a trapped magnetization in a so-called measuring direction, whilst the other layer has a magnetization orientable in said measuring direction under the effect of a measuring current traversing the magnetoresistance.

The term trapped magnetization is understood to mean a magnetization remaining substantially constant throughout the range of magnetic fields which it is aimed to measure.

The proposed structure offers a significantly greater magnetoresistance amplitude than the spin valve structures only having two magnetic layers. The amplitude of the magnetoresistance is 50 to 100% higher than with a single spin valve structure, as a result of the presence of three instead of two magnetic layers. Moreover, the second, free, magnetic layer in said structure is approximately in the center of the current layer flowing through the multilayer magnetoresistance. Therefore the polarization field created by the measuring current is virtually zero at said layer, so that it can retain a high susceptibility even in the presence of a high current density.

Moreover, compared with the double spin valve structure described in document (6), the present structure avoids the deposition of a NiFe underlayer and a first FeMn layer necessary for the trapping of one of the outer magnetic material layers. This leads to easier manufacture. The elimination of the NiFe and FeMn underlayers also permits a greater amplitude of the magnetoresistance effect due to the elimination of the derivation of the current in said two underlayers, which do not participate in the magnetoresistance effect.

According to an aspect of the invention, in the absence of an external magnetic field, the second layer can have a magnetization substantially perpendicular to the measuring direction, which permits the obtaining of a more linear response of the magnetoresistance at a magnetic field to be measured.

The trapped magnetization of one of the first and third ferromagnetic layers can be obtained by making said layer from an alloy based on cobalt and iron containing anisotropic rare earths giving it a high coercivity and which consequence make it possible to "block" the magnetization of said layer in a desired direction.

Another possibility is to add to the ferromagnetic layer an antiferromagnetic material layer in contact with the latter in order to block its magnetization exchange anisotropy.

According to another aspect of the invention, the stack can also have separating or spacing layers made from a material incorporating cobalt between respectively each ferromagnetic layer and each adjacent, non-magnetic layer. These layers of cobalt or an alloy largely containing cobalt, permit a further improvement of the magnetoresistance effect.

The invention also proposes a sensor equipped with a magnetoresistance like that described.

This magnetoresistance can be produced in accordance with a process in which formation takes place of a stack by successively depositing on a substrate a first ferromagnetic material layer having a magnetization orientable under the effect of an electric current, a non-magnetic, conductive material layer, a second soft ferromagnetic material layer, a second non-magnetic, conductive material layer and a third ferromagnetic material layer with a trapped magnetization, a magnetic field being applied substantially perpendicular to the measuring direction during the deposition of the second soft, ferromagnetic material layer in order to give the latter an axis of easy magnetization.

Other features and advantages can be gathered from the following description of a non-limitative embodiment with reference to the attached drawings.

BRIEF DESCRIPTION OF THE DRAWINGS

FIG. 4 is a diagrammatic section of a magnetoresistance according to the invention.

FIG. 5 is a diagrammatic section of a magnetoresistance according to the invention representing a variant compared with FIG. 4.

DETAILED DESCRIPTION OF EMBODIMENTS

Figure 1:
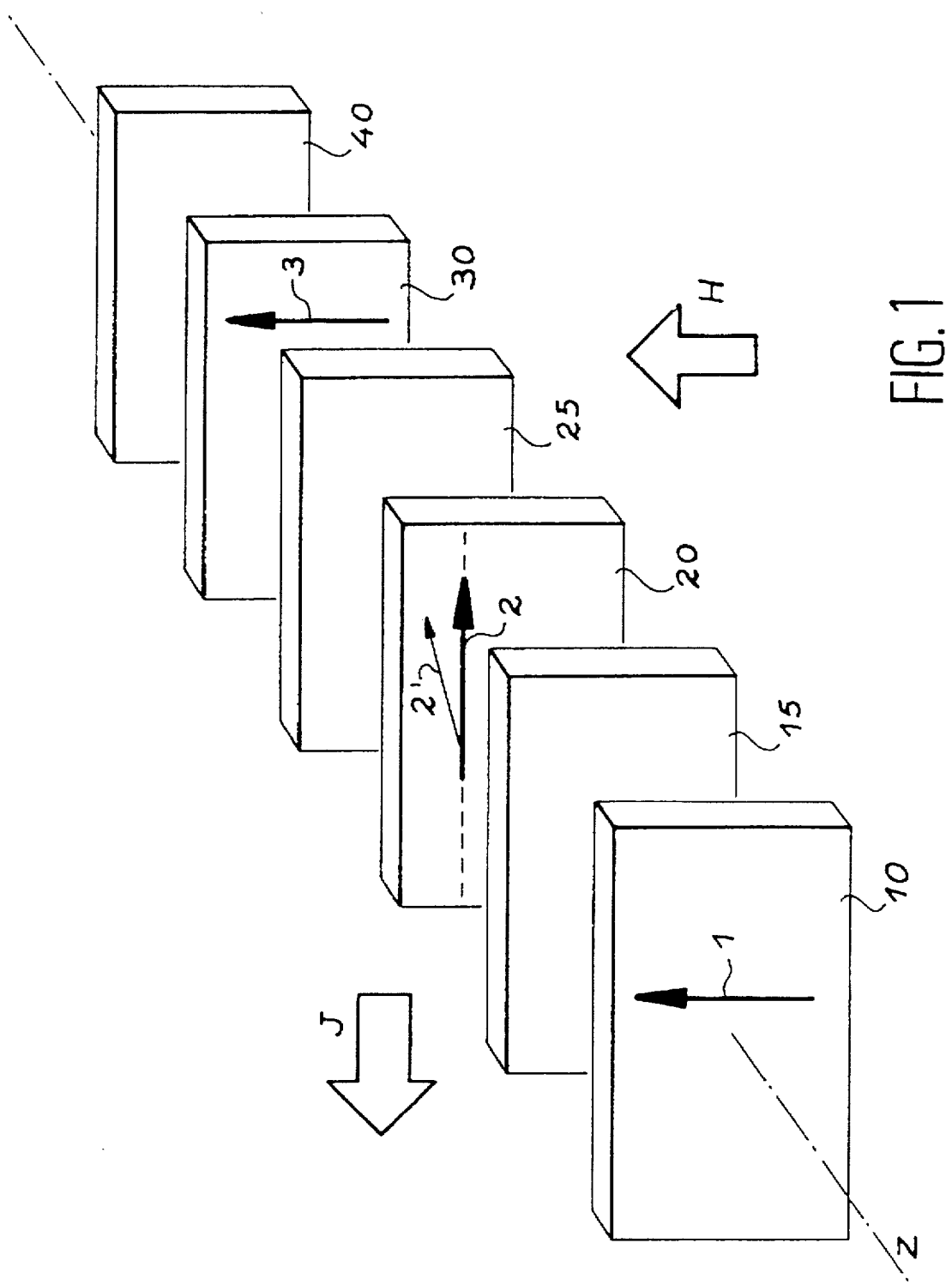
FIG. 1 is an exploded view of the main functional layers of a magnetoresistance according to the invention.

As is shown in FIG. 1, the multilayer structure of the magnetoresistance essentially comprises three layers 10, 20 and 30 based on ferromagnetic transition metals (such as iron, cobalt, nickel or their alloys) having thicknesses between a few atomic planes and approximately a dozen nanometers. These three magnetic layers are separated by two non-magnetic, good conducting, metal layers 15, 25, whose thickness must be adequate for the magnetizations of the magnetic layers to be weakly coupled across said separating layers, but well below the free mean path of the electrons through the non-magnetic metal. The range of thicknesses meeting these two conditions extends from approximately 1 to 5 nm.

The layers 15 and 25 arranged respectively between the layers 10 and 20 on the one hand and the layers 20 and 30 on the other are preferably of copper, silver or gold. However, this choice does not exclude other good conducting metals such as e.g. aluminum or platinum.

The structure of the magnetoresistance and the materials to be indicated hereinafter are chosen so as to have a giant magnetoresistance effect. In the present case, this effect leads to a considerable change in the resistivity when the orientation of the layers changes from a so-called parallel state, which corresponds to the state where the layers 10, 20 and 30 have magnetizations parallel to one another, to a so-called antiparallel state where the magnetizations of the layers 10 and 30 are parallel, but where the magnetization of the layer 20 is substantially opposite to that of the layers 10 and 30.

The magnetization of the layer 30 is trapped, (i.e., blocked) in the direction parallel to the field to be measured or measuring field (i.e., a measuring direction). Trapping is ensured by an exchange anisotropy effect with an antiferromagnetic layer 40. The layer 40 is e.g. an antiferromagnetic FeMn layer or a ferrimagnetic TbCo layer deposited on the layer 30. The magnetic trapping of the layer 30 can also be obtained by other means described hereinafter.

The layer 20 is a soft magnetic material layer, whose magnetization direction can easily be modified by the field to be measured applied to the magnetoresistance. It is e.g. a permalloy layer of composition $Ni_{80}Fe_{20}$.

In order to obtain a linear response of a sensor including a magnetoresistance according to the invention, the magnetization of the layer 20 is preferably aligned substantially perpendicular to the measuring direction when a zero external field is applied to the magnetoresistance. This preferred, spontaneous orientation direction of the magnetization of the layer 20 can result from shape anisotropy effects of the magnetoresistance, where an axis of easy magnetization of the layer 20 is parallel to the greatest length of the magnetoresistance. The term axis of easy magnetization is an axis corresponding to the spontaneous orientation direction of the magnetization of the material in a zero field.

As is described hereinafter, the preferred direction can also be imposed during the formation of the layer 20.

Layer 10, made from an alloy based on nickel, iron and preferably cobalt, has a magnetization which is not trapped in the absence of a current flowing in the magnetoresistance. However, when a current, here a measuring current, flows through the magnetoresistance, the magnetization of the layer 10 is oriented in a direction substantially parallel to the magnetization of the layer 30, under the effect of the magnetic field created by the current within the magnetoresistance. The arrows 1, 2 and 3 of FIG. 1 respectively show the orientation of the magnets of the layers 10, 20 and 30 in the absence of an applied external field and in the presence of the measuring current J. The arrow 2' shows the magnetization of the modified layer 20 in the presence of a field H to be measured.

The arrow 1 indicates the polarization of the layer 10 under the effect of the measuring current J. This effect can be better understood with FIG. 2, on which the rectangle 100 represents a cross-section of the multilayer magnetoresistance perpendicular to its greatest length and starting, perpendicular to the measuring current J. The rectangle 100 also represents a uniform layer of the measuring current J passing through the magnetoresistance.

When the measuring current J flows through the magnetoresistance with a current density j typically of $5.10^6$ to $5.10^7$ A/cm$^2$ said current generates a magnetic field B within the sensor, which can be high compared with the order of magnitude of the field H which it is wished to measure. Thus, assuming that the current density is uniform in the material (equal to J) in such a way that the current forms a uniform layer 100 over the entire thickness of the multilayer structure, the field is then zero in the median plane P, i.e. the plane parallel to the outer surfaces and located at half the thickness of the multilayer structure and increases linearly on moving away from said median plane P in order to reach its maximum value on the outer lateral surfaces 100a and 100b of the magnetoresistance. Using Ampere's theorem:

$$\oint_C \vec{H} \cdot \vec{dl} = I = \int\int_S j dS,$$

it is shown that the magnetic field created by the current layer at z (z=0 corresponding to the median plane) varies as H(z)=jz. For example for j=2.10$^7$ A/cm$^2$, H(z)=0.2 z, where z is expressed in nanometers of H(z) in kA/m. Thus, for a multilayer system of total thickness e=20 nm, the field at the surface 100a or 100b is $$H \pm \left( \frac{e}{2} \right) = \pm 2 kA/m,$$

comparable to a field to be measured of 1 to 2 kA/m.

Figure 2:
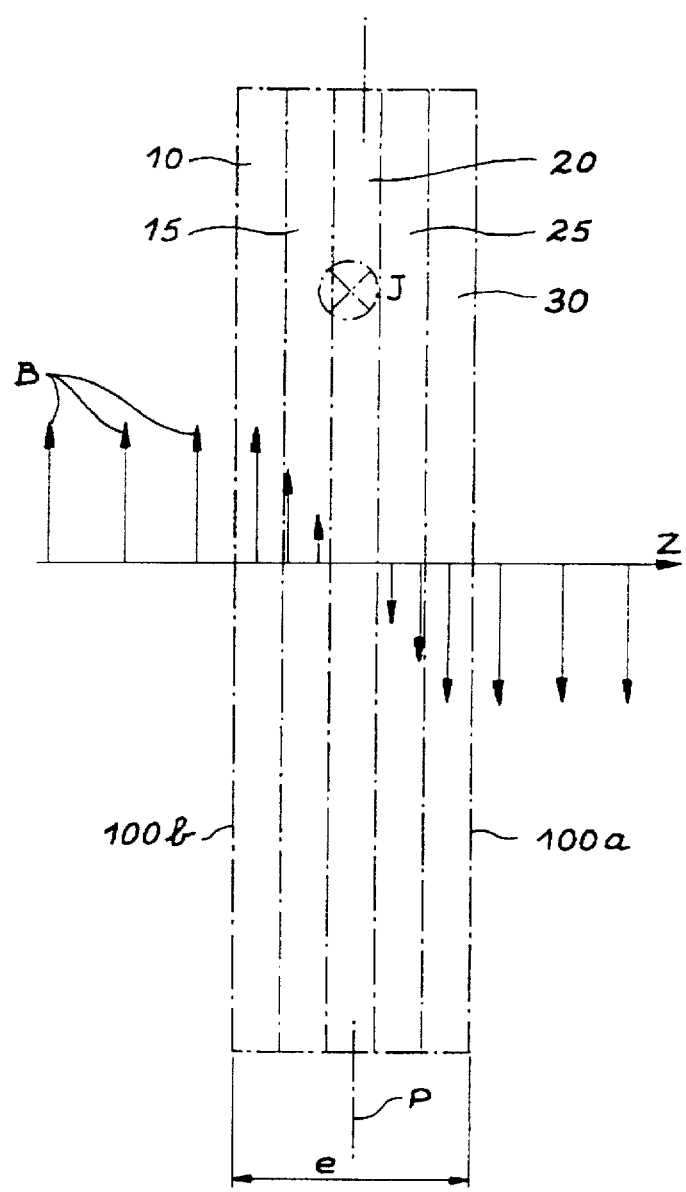
FIG. 2 is a diagrammatic representation of the magnetic field created by a measuring current in the magnetoresistance.

As the layer 20, whose location is suggested in FIG. 2, is in the vicinity of the center of the layer of current J flowing through the magnetoresistance, the magnetic field created by the measuring current on said central magnetic layer is zero or very weak compared with the field which it is wished to measure. Therefore, the magnetization of the central layer 20 can easily follow the variations of the applied external field to be measured.

However, there is a stronger magnetic field created by the measuring current on the layer 10 close to the surface 100b. This field acts on the magnetization of said layer and orients it in a direction substantially parallel to the measuring direction.

For the usual values of the measuring current, the autopolarization magnetic field (H) is, however, too low in order to affect the magnetization direction of the trapped layer 30.

It is possible to choose the current flow direction or the initial trapping direction of the magnetization of the layer 3, so that the magnetizations of the layers 10 and 30 are substantially parallel in the presence of a measuring current of e.g. approximately 2.10$^7$ A/m$^2$ and in the absence of an external field.

Figure 3:
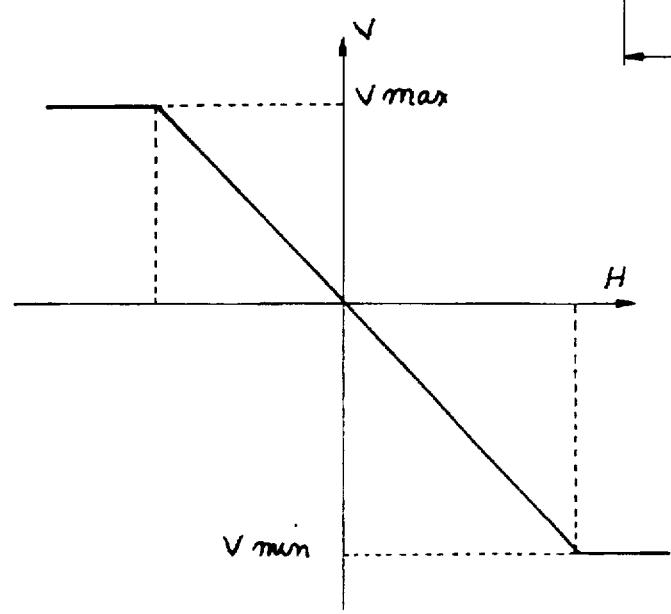
FIG. 3 is a curve showing the variation of the voltage at the terminals of a magnetoresistance according to the invention, as a function of the field to be measured.

FIG. 3 illustrates the variation of the voltage at the terminals of the magnetoresistance as a function of the field to be measured. The terminals 70, 72 are e.g. visible in FIGS. 4 or 5. For a field H of approximately 1 kA/m, the magnetizations of the three magnetic layers 10, 20, 30 are parallel. The resistivity of the magnetoresistance is then minimal and this leads to a minimum voltage $V_{min}$ at the terminals. For a field H of approximately −1 kA/m, the magnetization of the layer 20 becomes opposite to the magnetizations of the layers 10 and 30, which remain substantially parallel to one another. When the value of the field H increases, the resistivity decreases by a few per cent, which also leads to a reduction in the voltage of approximately 1 mV. Between the two limits $V_{max}$ and $V_{min}$, the variation of the voltage is substantially linear. A slight asymmetry compared with the zero field can exist if a magnetic coupling between the layer 20 and the layers 10 and 30 through the non-magnetic metals of the layers 15 and 20 remains. It is known that such a magnetic coupling exists for small thicknesses of magnetic materials. However, with the materials of the layers 15 and 25 and in particular the copper and silver deposited at low temperature, as well as gold, said coupling decreases rapidly with thicknesses of said layers exceeding 2 nm.

FIGS. 4 and 5 illustrate in greater detail the structure of the magnetoresistances according to the invention, in the two variants used. They also show an example of the order of formation of the layers in a process for the production of the magnetoresistance according to the invention.

Identical or similar elements carry the corresponding references in the drawings.

In the example of FIG. 4, the magnetoresistance is formed on a silicon substrate 6. It has in order starting from the substrate, successively the layers whose reference, nature and thickness are given in exemplified manner in table I.

TABLE I

| Layer reference | Material | Thickness in nm |
| --- | --- | --- |
| 9 | Ta | 5 |
| 10 | $Ni_{80}Fe_{20}$ | 6 |
| 11 | $Co_{70}Fe_{30}$ | 0.6 |
| 15 | Ag | 2.5 |
| 16 | $Co_{70}Fe_{30}$ | 0.6 |
| 20 | $Ni_{80}Fe_{20}$ | 5 |
| 21 | $Co_{70}Fe_{30}$ | 0.6 |
| 25 | Ag | 2.5 |
| 26 | $Co_{70}Fe_{30}$ | 0.6 |
| 30 | $Ni_{80}Fe_{20}$ | 4 |
| 40 | $Fe_{50}Mn_{50}$ | 8 |
| 41 | Ta | 5 |

The layers of the magnetoresistance can e.g. be formed by cathodic sputtering.

When silver is used for the formation of the layers 15 and 25, it is advantageous to cool the substrate with liquid nitrogen, in order to obtain a good structure of these layers. Reference can e.g. be made in this connection to document (7) at the end of the description. As has already been stated, the layers 15 and 25 can also be made from copper or gold, which dispenses with the cooling of the substrate. However, these materials do not offer such a good thermal stability as silver during subsequent annealing operations.

According to the invention, application takes place of a magnetic field substantially perpendicular to the measuring direction during the deposition of layer 20. This magnetic field of approximately 800 to 8000 A/m (10 to 100 Oe), makes it possible to induce an axis of easy magnetization in the "central" layer 20.

As is shown in FIG. 4, the magnetoresistance also has an elongated shape, e.g. the shape of a bar, whose length L is preferably parallel to said axis of easy magnetization. Thus, a shape anisotropy effect also contributes to the orientation of the magnetization of the magnetic layer 20 along its axis of easy magnetization. In the examples of FIGS. 4 or 5, the measuring current flows along the greatest length of the bar.

The magnetization of the layer 30 can be oriented and trapped perpendicular to the axis of easy magnetization of the layer 20 by heating the structure to a temperature just above the Néel temperature of the $Fe_{50}Mn_{50}$ layer 41, i.e. close to 200° C., followed by the cooling of the structure by applying a magnetic field in the desired trapping direction, namely substantially parallel to the measuring direction. It is pointed out that the Néel temperature is the temperature below which the spins of an antiferromagnetic material are brought into an antiparallel arrangement. For reference purposes, note should be taken of document (8) at the end of the description.

According to a variant of the invention corresponding to FIG. 5, the magneto-resistance has no antiferromagnetic layer 40. With the exception of the layer 40, the structure of the magnetoresistance is consequently similar to that of FIG. 4. However, the layer 30' corresponding to the layer 30 of FIG. 4, is a highly coercive material layer for which the magnetization is insensitive to any external field below about 10 kA/m. The layer 30' is e.g. of iron and cobalt alloy with an addition of anisotropic rare earths chosen from among samarium, neodymium, terbium and dysprosium.

The layers 11, 16, 21 and 26, whose presence is optional, constitute an interesting improvement to the invention. These layers of cobalt or $Co_{1-x}Fe_x$ alloy with $0 \leq x \leq 0.3$ with a thickness of 0.2 to 1 nm make it possible to significantly increase the amplitude of the giant magnetoresistance effect without increasing the saturation field or the hysteresis of the layer 20.

Another improvement according to the invention consists of replacing the material of layers 10 and 30 by cobalt or cobalt-rich alloys such as $Co_{70}Fe_{30}$. However, the layer 20 is still of a soft magnetic material.

A magnetoresistance like that described hereinbefore can be used in the manufacture of a magnetoresistive sensor. In the case of connections 70, 72, diagrammatically shown in FIG. 4, they can be located at the ends of the magnetoresistance, considered in the lengthwise direction. The connections permit the connection thereof to a not shown measuring circuit.

A measuring current of approximately $2.^7$ $A/cm^2$ makes it possible to create at the layer 10 a field of approximately 1600 A/m (20 Oe) adequate for orienting the magnetization of the layer 10 substantially perpendicular to that of the layer 20. The direction of the measuring current in the sensor is then chosen so that the magnetizations of the layers 10 and 30 are parallel and not antiparallel.

DOCUMENTS REFERRED TO IN THE PRESENT APPLICATION (1) D. A. Thompson et al., IEEE Trans. Mag. Mag-11, p 1039, 1975
(2) IEEE Translation Journal on magnetics in Japan, vol. 7, No. 9, September 1992, "Magnetoresistance of multilayers" by H. Yamamoto and T. Shinjo, pp 674–684
(3) B. DIENY, Journal of Magnetism and Magnetic Materials 136, 1994, pp 335–359
(4) U.S. Pat. No. 4,949,039
(5) Physical review B, vol. 43, No. 1, 1 Jan. 1991, "Giant magnetoresistance in soft ferromagnetic multilayers" by B. Dieny et al., pp 1297–1300
(6) U.S. Pat. No. 5,287,238
(7) FR-A-2 698 965
(8) U.S. Pat. No. 5,206,590

I claim:

1. Magnetoresistance having a stack of first, second and third ferromagnetic material layers, the second layer being separated from the first and third layers respectively by first and second non-magnetic, electrically conductive material layers, and made from a soft material having a magnetization which can be modified by an external magnetic field, characterized in that one of the first and third layers has a trapped magnetization in a so-called measuring direction, the other of the first and third layers has a magnetization orientable in said measuring direction under the effect of a measuring current (J) traversing the magnetoresistances, and the second layer of ferromagnetic material is located in the vicinity of a center of the layer of measuring current.

2. Magnetoresistance according to claim 1, wherein in the absence of an external magnetic field, the second layer has a magnetization substantially perpendicular to the measuring direction.

3. Magnetoresistance according to claim 1, wherein the non-magnetic material is chosen from among copper, silver and gold.

4. Magnetoresistance according to claim 1, wherein the non-magnetic material layers have a thickness between 1 and 5 nm.

5. Magnetoresistance according to claim 1, wherein the layer having a trapped magnetization is made from a high coercivity alloy based on cobalt and iron containing anisotropic rare earths.

6. Magnetoresistance according to claim 1, wherein the stack also has an antiferromagnetic material layer in contact with the layer having a trapped magnetization in order to block the magnetization thereof.

7. Magnetoresistance according to claim 1, wherein the stack has separating layers made from a material incorporating cobalt respectively between each ferromagnetic layer and between each adjacent non-magnetic layer.

8. Magnetoresistance according to claim 7, wherein the separating layers are of an alloy $Co_{(1-x)}Fe_x$ in which $0 \leq x \leq 0.3$.

9. Application of the magnetoresistance according to claim 1 to a magnetic field measuring sensor.

10. Process for the production of a magnetoresistance according to claim 1, wherein formation takes place of a stack by successively depositing on a substrate a first ferromagnetic material layer having a magnetization orientable under the effect of an electric current, a conductive, non-magnetic material layer, a second soft ferromagnetic material layer, a second conductive, non-magnetic material layer and a third ferromagnetic material layer with a trapped magnetization, a magnetic field being applied substantially perpendicular to the measuring direction during the deposition of the second, soft ferromagnetic material layer in order to give the latter an axis of easy magnetization.

11. Process according to claim 10, wherein the layers are deposited by cathodic sputtering.

12. Process according to claim 10, wherein deposition takes place of a $Fe_{50}Mn_{50}$ antiferromagnetic alloy layer on the third ferromagnetic layer, the stack is heated to a temperature exceeding the Néel temperature of the antiferromagnetic layer and the stack is cooled by applying a magnetic field parallel to the measuring direction.

13. Process according to claim 10, wherein, prior to the deposition of the first ferromagnetic material layer to the substrate, a tantalum layer is formed on the substrate.

* * * * *